(12) United States Patent
Yoshimatsu

(10) Patent No.: US 12,243,789 B2
(45) Date of Patent: Mar. 4, 2025

(54) SEMICONDUCTOR DEVICE, SEMICONDUCTOR SYSTEM, MOVING BODY, AND METHOD FOR MANUFACTURING SEMICONDUCTOR DEVICE

(71) Applicant: Mitsubishi Electric Corporation, Tokyo (JP)

(72) Inventor: Naoki Yoshimatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 277 days.

(21) Appl. No.: 17/753,934

(22) PCT Filed: Dec. 13, 2019

(86) PCT No.: PCT/JP2019/048964
§ 371 (c)(1),
(2) Date: Mar. 18, 2022

(87) PCT Pub. No.: WO2021/117227
PCT Pub. Date: Jun. 17, 2021

(65) Prior Publication Data
US 2022/0336302 A1    Oct. 20, 2022

(51) Int. Cl.
*H01L 23/053*     (2006.01)
*H01L 21/48*      (2006.01)
(Continued)

(52) U.S. Cl.
CPC ........ *H01L 23/053* (2013.01); *H01L 21/4817* (2013.01); *H01L 23/3735* (2013.01);
(Continued)

(58) Field of Classification Search
CPC ............... H01L 23/053; H01L 21/4817; H01L 23/3735; H01L 24/32; H01L 24/48;
(Continued)

(56) References Cited

U.S. PATENT DOCUMENTS

2016/0365721 A1    12/2016   Soma et al.

FOREIGN PATENT DOCUMENTS

JP    2010-114257 A    5/2010
JP    2015-225918 A    12/2015
(Continued)

OTHER PUBLICATIONS

JP2015225918 (Year: 2015).*
(Continued)

*Primary Examiner* — Patricia D Valenzuela
(74) *Attorney, Agent, or Firm* — Studebaker & Brackett PC

(57) ABSTRACT

A semiconductor device includes a laminated body, a semiconductor element, and a cooler. The laminated body includes a first conductor layer, a first insulator layer, a second conductor layer, a second insulator layer, and a third conductor layer. The first conductor layer, the first insulator layer, the second conductor layer, the second insulator layer and the third conductor layer are laminated. The first insulator layer is arranged between the first conductor layer and the second conductor layer, and electrically insulates the first conductor layer from the second conductor layer. The second insulator layer is arranged between the second conductor layer and the third conductor layer, and electrically insulates the third conductor layer from the second conductor layer. The semiconductor element is mounted on the first conductor layer. The cooler is connected to the third conductor layer.

13 Claims, 11 Drawing Sheets

(51) Int. Cl.
  *H01L 23/00*    (2006.01)
  *H01L 23/373*   (2006.01)
  *H02P 29/024*   (2016.01)

(52) U.S. Cl.
  CPC .............. *H01L 24/32* (2013.01); *H01L 24/48* (2013.01); *H01L 24/73* (2013.01); *H02P 29/024* (2013.01); *H01L 2224/32225* (2013.01); *H01L 2224/48175* (2013.01); *H01L 2224/49171* (2013.01); *H01L 2224/73265* (2013.01); *H01L 2924/181* (2013.01)

(58) Field of Classification Search
  CPC ........... H01L 24/73; H01L 2224/32225; H01L 2224/48175; H01L 2224/73265; H01L 21/565; H01L 23/3121; H01L 24/33; H01L 24/49; H01L 24/92; H01L 2224/06181; H01L 2224/29101; H01L 2224/32245; H01L 2224/45124; H01L 2224/83801; H01L 23/04; H01L 23/24; H01L 23/36; H01L 23/4334; H01L 23/49562; H01L 25/072; H01L 2224/0603; H01L 2224/33181; H01L 2224/48091; H01L 2224/49111; H01L 2224/92247; H01L 2924/181; H01L 2924/19107; H02P 29/024
  See application file for complete search history.

(56) References Cited

FOREIGN PATENT DOCUMENTS

| | | |
|---|---|---|
| JP | 2017-005125 A | 1/2017 |
| WO | 2014/091608 A1 | 6/2014 |

OTHER PUBLICATIONS

JP2010114257 (Year: 2011).*
International Search Report issued in PCT/JP2019/048964; mailed Mar. 17, 2020.
An Office Action mailed by the Japan Patent Office on Oct. 4, 2022, which corresponds to Japanese Patent Application No. 2021-563567 and is related to U.S. Appl. No. 17/753,934; with English translation.
An Office Action mailed by China National Intellectual Property Administration on Sep. 5, 2024, which corresponds to Chinese Patent Application No. 201980102826.X and is related to U.S. Appl. No. 17/753,934; with English language translation.

* cited by examiner

F I G. 1
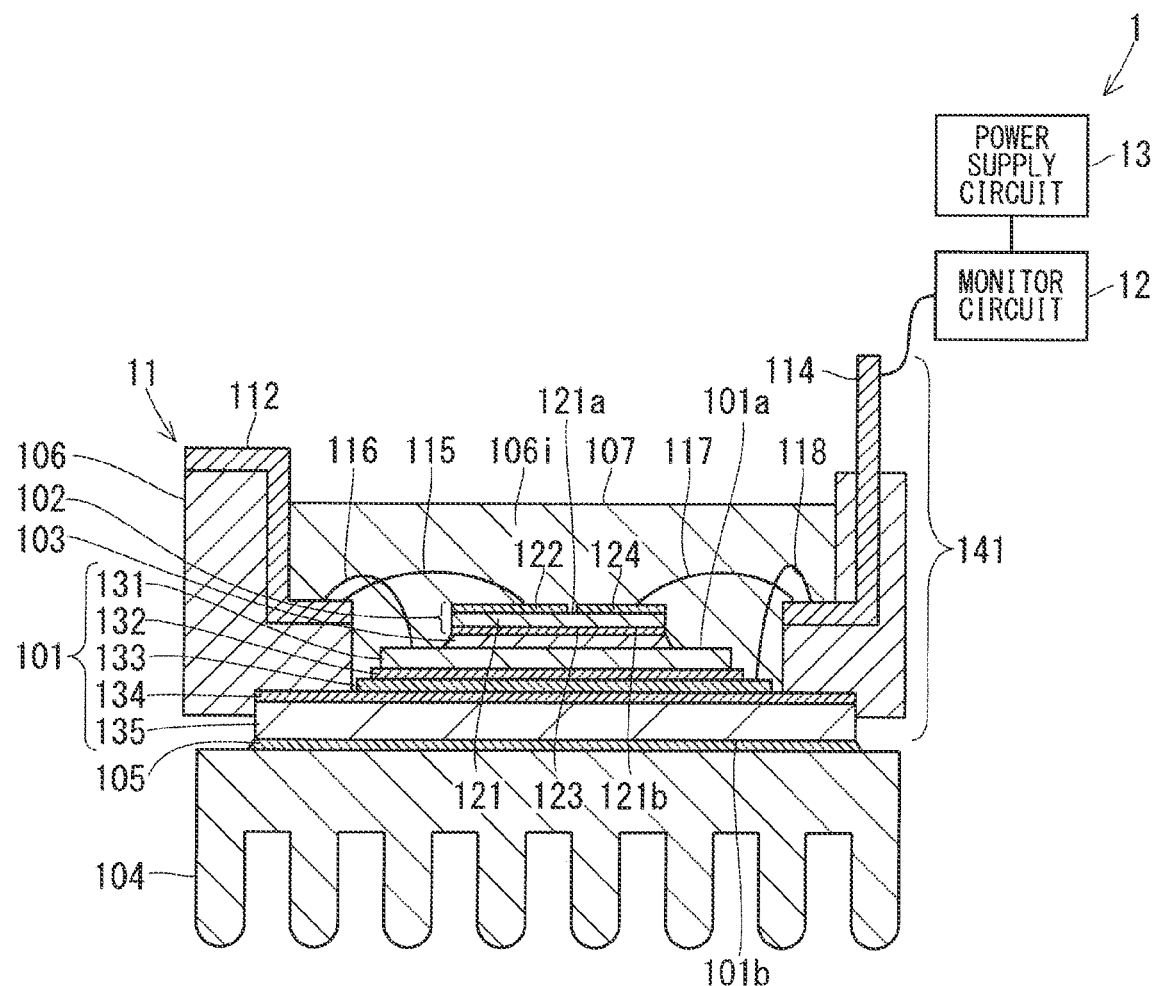

F I G. 7
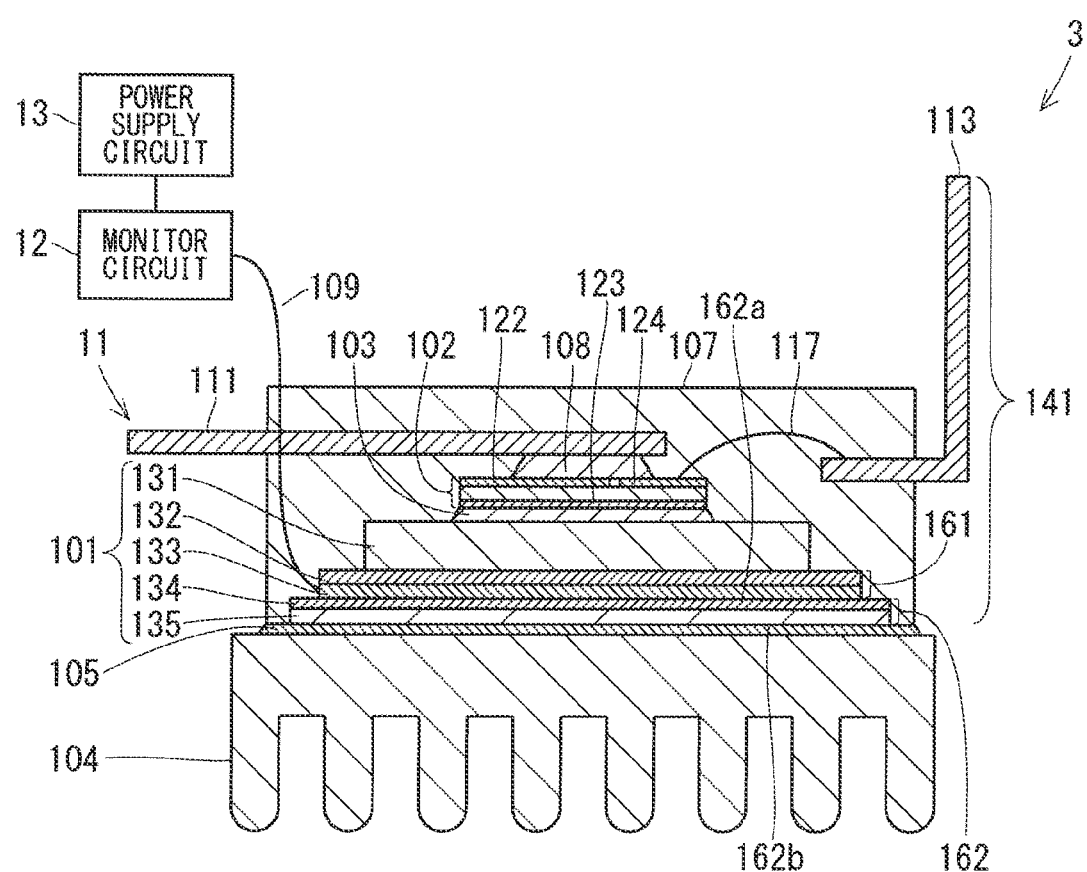

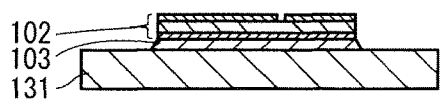
FIG. 8A
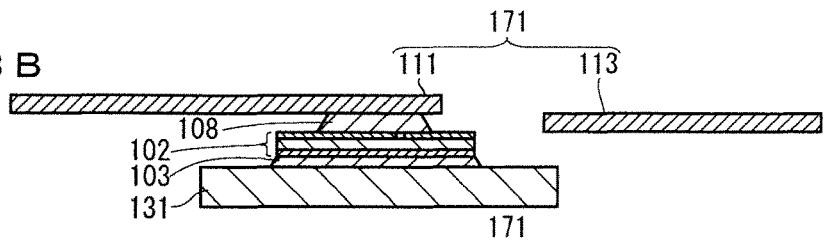
FIG. 8B
FIG. 8C
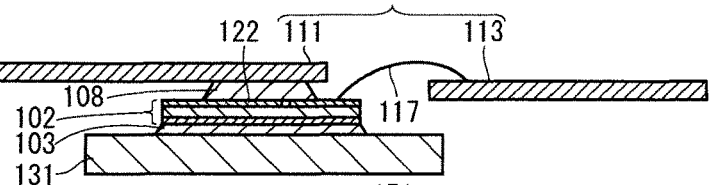
FIG. 8D
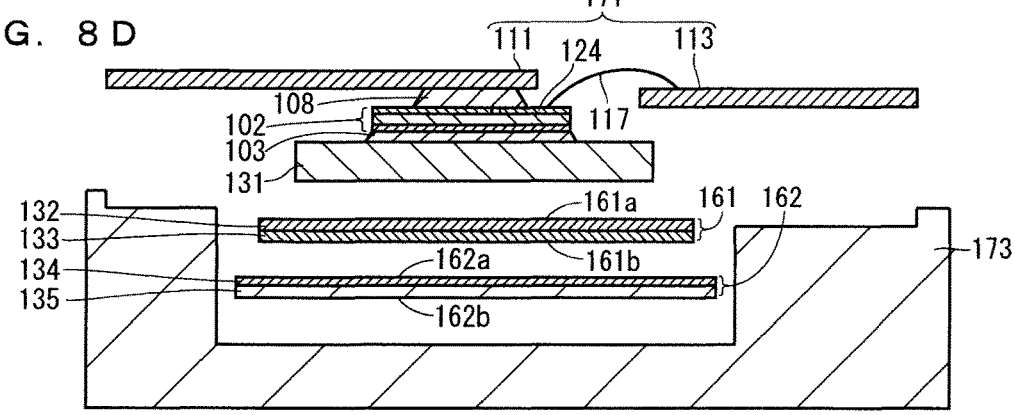
FIG. 8E
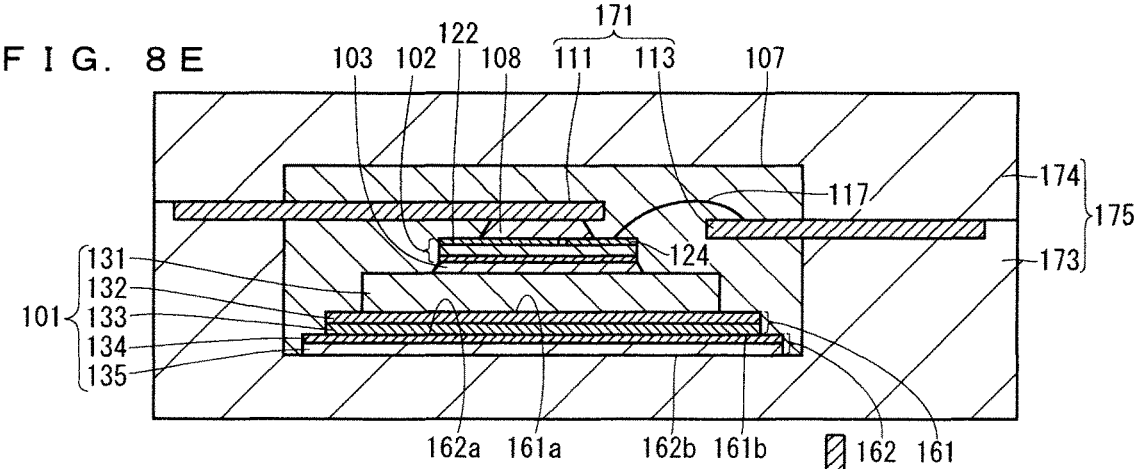
FIG. 8F
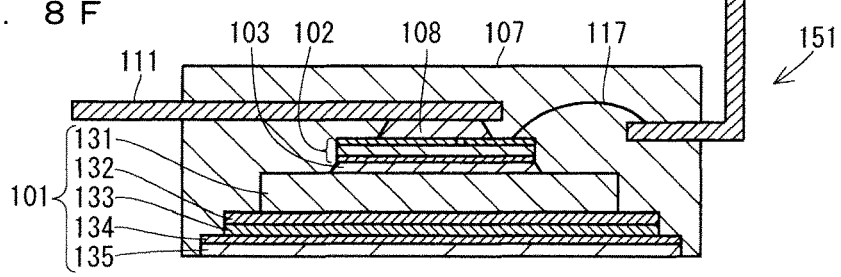

F I G. 9
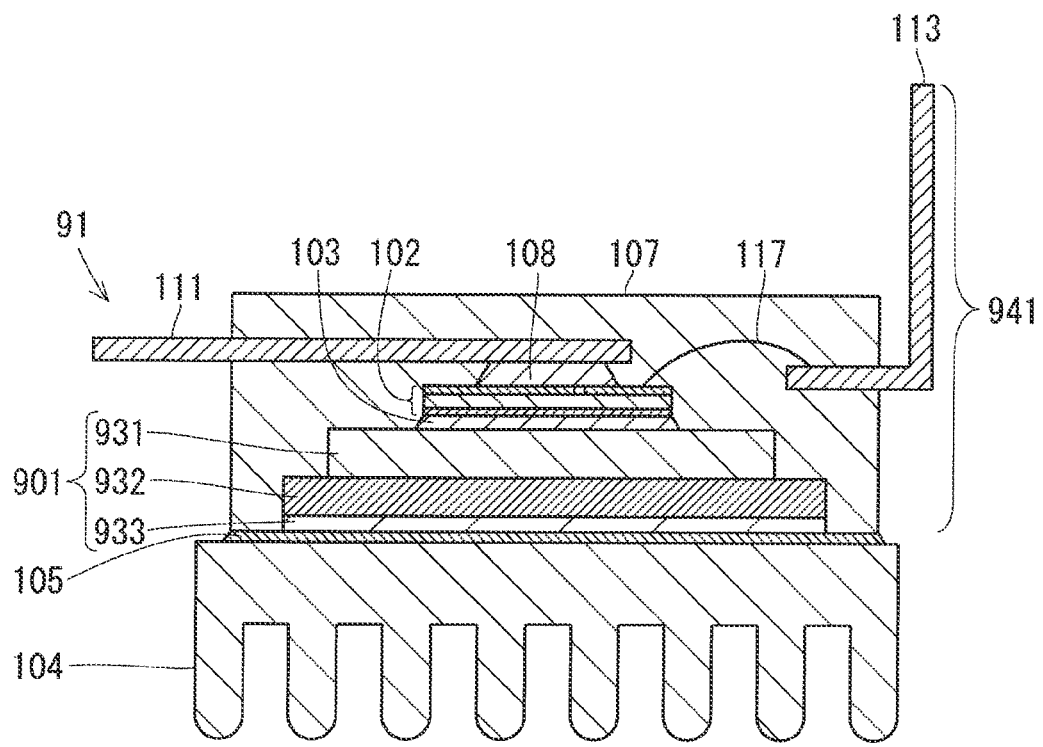

F I G. 1 0
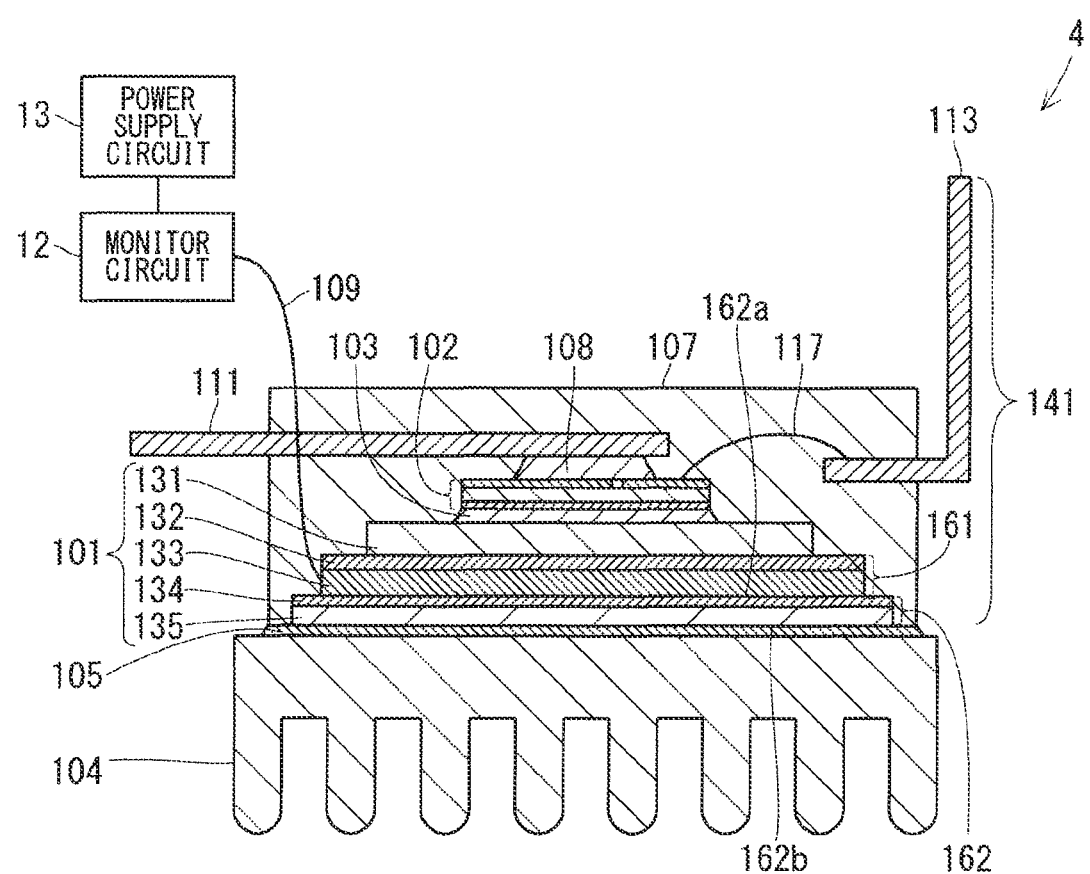

SEMICONDUCTOR DEVICE, SEMICONDUCTOR SYSTEM, MOVING BODY, AND METHOD FOR MANUFACTURING SEMICONDUCTOR DEVICE

TECHNICAL FIELD

The present invention relates to a semiconductor device, a semiconductor system, a moving body, and a method of manufacturing the semiconductor device.

BACKGROUND ART

Moving bodies such as electric vehicles and trains are equipped with a motor and an inverter for driving the motor. A power module is built into the inverter. The power module includes a semiconductor element that emits a large amount of heat. Therefore, the inverter includes a cooler that emits heat generated by the semiconductor element. The power module includes an insulator that electrically insulates the semiconductor element from the cooler. The insulator transfers the heat emitted by the semiconductor element to the cooler.

In the technique described in Patent Document 1, a current flowing through a power transistor is monitored, and when the current reaches a certain value, the power transistor is cut off (paragraph 0056). This protects the power transistor from the overcurrent state (paragraph 0056). Also, a voltage between the gate and the source of the power transistor is monitored and the power transistor is cut off when an overvoltage is applied thereto (paragraph 0057). This protects the power transistor from the overcurrent state (paragraph 0057).

PRIOR ART DOCUMENTS

Patent Documents

[Patent Document 1] Japanese Patent Application Laid-Open No. 2017-005125

SUMMARY

Problem to be Solved by the Invention

When the insulator that electrically insulates the semiconductor element from the cooler deteriorates and is broken, the semiconductor element is electrically short-circuited with the cooler, and a problem such as a ground fault of the semiconductor element occurs. Therefore, in order to suppress the occurrence of problems such as a ground fault in the semiconductor element, monitoring of whether or not the insulator has deteriorated in a constant manner is required to perform. However, in order to check whether the insulator has deteriorated, work is required where the power module is removed from the inverter provided in the moving body and the partial discharge voltage of the insulator provided in the removed power module is measured, and the like. Therefore, monitoring whether or not the insulator has deteriorated in a constant manner is difficult to perform. For this reason, a problem such as a ground fault of the semiconductor element suddenly occurs in many cases.

The power module controls a high current and a high voltage. For this reason, when a problem such as a ground fault of the semiconductor element occurs, other electronic devices provided in the moving body may be broken, or a person riding on the moving body may be subject to an electric shock. Therefore, a defect that the semiconductor element is electrically short-circuited with the cooler is fatal.

The insulator is made of ceramic materials, a resin, a resin mixed with a filler, or the like. The filler is made of alumina or the like and is mixed in to increase the thermal conductivity of the insulator. However, when the insulator is made of ceramic materials, initial defects such as minute cracks that cause the insulator to be broken may be inherent in the insulator. Further, when the insulator is made of a resin or a resin mixed with a filler, initial defects such as voids that may cause the insulator to be broken may be inherent in the insulator. Further, when the insulator is made of a resin mixed with a filler, initial defects such as aggregation of filler that may cause the insulator to be broken may be inherent in the insulator.

The technique for protecting a semiconductor element represented by the technique described in Patent Document 1 allows suppression of a short circuit in a conduction path through which a main current flows, but does not allow suppression of a ground fault of the semiconductor element.

For these reasons, the thickness of the insulator is made larger enough so that the insulating property of the insulator has a sufficient margin. For example, when the power module is incorporated into an inverter with a 600V power supply voltage, the thickness of the insulator is made larger so that the insulator has a dielectric strength of 6000V or higher, which is 10 times the 600V power supply voltage. However, even when the thickness of the insulation is made larger so that the insulating property of the insulator has a sufficient margin, and when the initial defects inherent in the insulator cannot be detected before the power module is shipped, the insulator may be broken and a problem such as a ground fault in the semiconductor element occurs.

On the other hand, in the design of the power module, the heat radiation design that suits the operating conditions of the semiconductor element must be adopted. In heat radiation design, thermal resistance is used as an index of heat radiation property, in which the smaller the thermal resistance, the higher the heat radiation property. Further, in terms of a thermal resistance, the contribution of the insulator having only low thermal conductivity is dominant and reduction in thickness of the insulator is effective in reducing the thermal resistance. However, if the thickness of the insulator is made larger so that the insulating property of the insulator has a sufficient margin, the thermal resistance of the insulator becomes large. When the thermal resistance of the insulator becomes large, sufficient transfer of the heat emitted from the semiconductor element to the cooler becomes difficult, and releasing of the heat emitted by the semiconductor element to the outside of the power module becomes difficult. As a result, the temperature of the semiconductor element rises so high that breaking of the semiconductor element, breaking of the aluminum wires provided in the power module, and the like happen.

These problems also occur in semiconductor devices other than the power modules incorporated in inverters that drive motors.

The present invention is made in view of the problems described above. The object of the present invention is to provide a semiconductor device in which that a semiconductor element is electrically short-circuited with a cooler is suppressed and heat emitted by the semiconductor element is efficiently released.

Means to Solve the Problem

The present invention relates to a semiconductor device.

The semiconductor device includes a laminated body, a semiconductor element, and a cooler.

The laminated body includes a first conductor layer, a first insulator layer, a second conductor layer, a second insulator layer, and a third conductor layer.

The first conductor layer, the first insulator layer, the second conductor layer, the second insulator layer and the third conductor layer are laminated. The first insulator layer is arranged between the first conductor layer and the second conductor layer, and electrically insulates the first conductor layer from the second conductor layer. The second insulator layer is arranged between the second conductor layer and the third conductor layer, and electrically insulates the third conductor layer from the second conductor layer.

The semiconductor element is mounted on the first conductor layer.

The cooler is connected to the third conductor layer.

Effects of the Invention

According to the present invention, the first conductor layer and the third conductor layer are electrically insulated from the second conductor layer arranged between the first conductor layer and the third conductor layer. Therefore, even if one of the first conductor layer and the third conductor layer is electrically short-circuited with the second conductor layer, the first conductor layer is not electrically short-circuited with the third conductor layer. This suppresses the electrical short circuit of the semiconductor element mounted on the first conductor layer with the cooler connected to the third conductor layer.

Further, according to the present invention, even when the margin of the insulator property of the first insulator layer and the second insulator layer is made smaller, the electrical short circuit of the semiconductor element with the cooler can be suppressed. Therefore, the total thickness of the first insulator layer and the second insulator layer can be reduced. As a result, the thermal resistance of the laminated body can be reduced. As a result, the heat emitted by the semiconductor element can be efficiently released.

The objects, features, aspects, and advantages of the present invention will become more apparent from the following detailed description and the accompanying drawings.

BRIEF DESCRIPTION OF DRAWINGS

FIG. 1 A diagram schematically illustrating a semiconductor system of the first embodiment.

FIG. 7 A diagram schematically illustrating a semiconductor system of the third embodiment.

FIGS. 8A to 8F Cross-sectional views illustrating a method of manufacturing a semiconductor device provided in the semiconductor system of the third embodiment.

FIG. 9 A cross-sectional view schematically showing a cross section of a semiconductor device of the second reference example.

FIG. 10 A diagram schematically illustrating a semiconductor system of the fourth embodiment.

DESCRIPTION OF EMBODIMENT(S)

1. First Embodiment

1.1 Heat Radiation and Insulation

Figure 2:
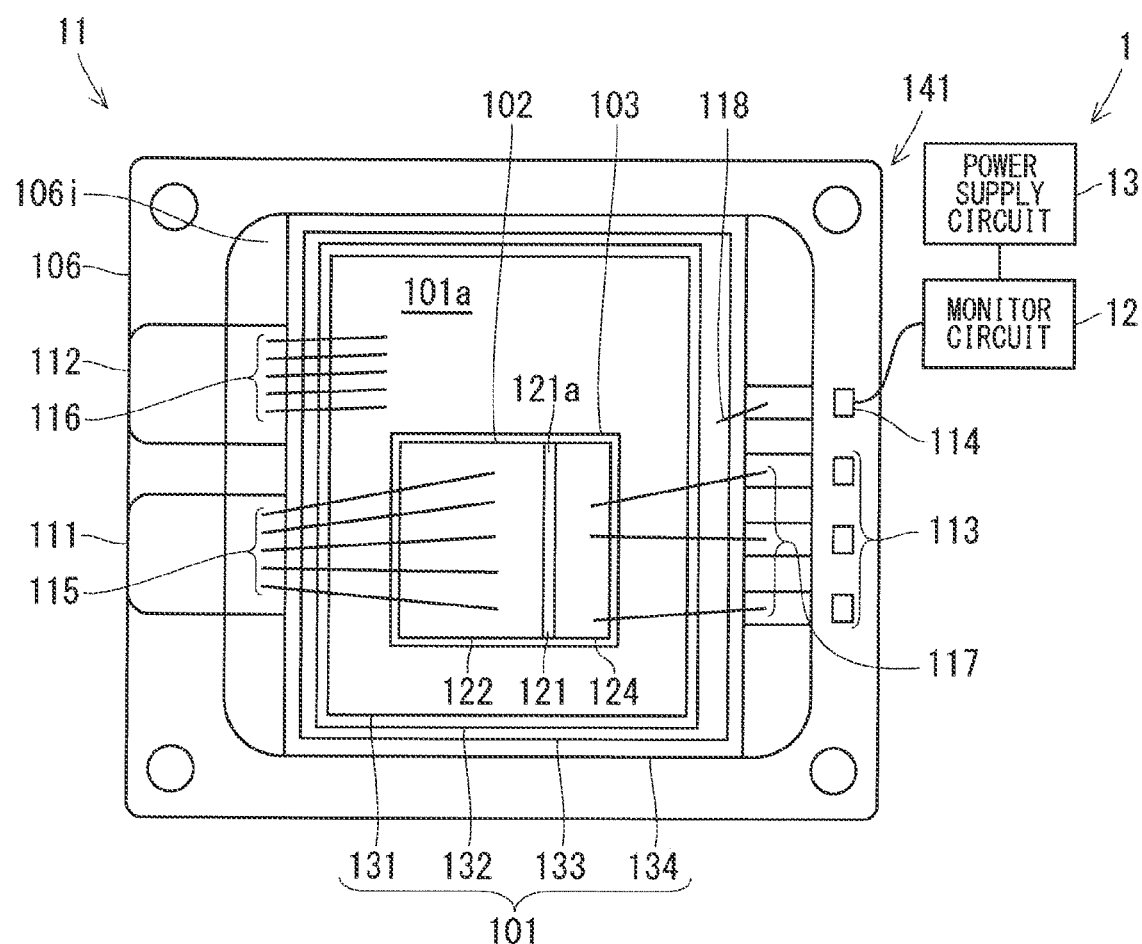
FIG. 2 A diagram schematically illustrating the semiconductor system of the first embodiment.

FIGS. 1 and 2 are diagrams schematically illustrating a semiconductor system of the first embodiment. FIG. 1 includes a cross-sectional view schematically showing a cross section of a semiconductor device provided in the semiconductor system of the first embodiment. FIG. 2 includes a top view schematically illustrating the upper surface of the semiconductor device from which a mold resin is removed from the semiconductor device provided in the semiconductor system of the first embodiment.

A semiconductor device 11 provided in the semiconductor system 1 of the first embodiment illustrated in FIGS. 1 and 2 includes a laminated body 101, a semiconductor element 102, solder 103, a cooler 104, and a thermal paste 105.

The semiconductor element 102 and the solder 103 are arranged on a first main surface 101a of the laminated body 101. The solder 103 is arranged between the semiconductor element 102 and the laminated body 101. The solder 103 is a bonding material bonding the semiconductor element 102 to the laminated body 101. The solder 103 may be replaced with other types of bonding material. For example, the solder 103 may be replaced with a brazing filler metal. The solder 103 may be omitted and the semiconductor element 102 may be directly bonded to the laminated body 101.

The cooler 104 and the thermal paste 105 are arranged on a second main surface 101b of the laminated body 101. The second main surface 101b of the laminated body 101 is on the side opposite to the side where the first main surface 101a of the laminated body 101 is located. The thermal paste 105 is arranged between the cooler 104 and the laminated body 101. The thermal paste 105 fills the gap between the cooler 104 and the laminated body 101. The thermal paste 105 is a heat radiation material that promotes heat transfer from the laminated body 101 to the cooler 104. The thermal paste 105 may be replaced with another type of heat radiation material. For example, the thermal paste 105 may be replaced with a heat radiation sheet. Thermal paste 105 may be omitted and heat may be transferred directly from the laminated body 101 to the cooler 104.

The laminated body 101 is arranged between the semiconductor element 102 and the cooler 104. The laminated body 101 separates the semiconductor element 102 from the cooler 104. Accordingly, the laminated body 101 electrically insulates the semiconductor element 102 from the cooler 104. The laminated body 101 constitutes a substrate.

The heat emitted by the semiconductor element 102 is sequentially transferred to the cooler 104 via the solder 103, the laminated body 101, and the thermal paste 105. The heat transferred to the cooler 104 is released from the cooler 104 to the outside of the semiconductor device 11.

1.2 Electrical Connection

As shown in FIGS. 1 and 2, the semiconductor device 11 includes a first main terminal 111, a second main terminal 112, a first signal terminal 113, a first conductor wire 115, a second conductor wire 116, and a third conductor wire 117. As shown in FIGS. 1 and 2, the semiconductor element 102 includes a semiconductor substrate 121, a first main electrode 122, a second main electrode 123, and a signal electrode 124. The laminated body 101 includes a first conductor layer 131, as shown in FIGS. 1 and 2.

The first main electrode 122 and the signal electrode 124 are arranged on a first main surface 121a of the semiconductor substrate 121. The second main electrode 123 is arranged on a second main surface 121b of the semiconductor substrate 121. The second main surface 121b of the semiconductor substrate 121 is on the side opposite to the side where the first main surface 121a of the semiconductor substrate 121 is located.

The first conductor layer 131 is exposed to the first main surface 101a of the laminated body 101.

One end of the first conductor wire 115 is connected to the first main electrode 122. The other end of the first conductor wire 115 is connected to the first main terminal 111. Accordingly, the first conductor wire 115 electrically connects the first main terminal 111 to the first main electrode 122.

The upper surface of the solder 103 is connected to the second main electrode 123. The lower surface of the solder 103 is connected to the first conductor layer 131. One end of the second conductor wire 116 is connected to the first conductor layer 131. The other end of the second conductor wire 116 is connected to the second main terminal 112. Accordingly, the second conductor wire 116, the first conductor layer 131, and the solder 103 electrically connect the second main terminal 112 to the second main electrode 123.

One end of the third conductor wire 117 is connected to the signal electrode 124. The other end of the third conductor wire 117 is connected to the first signal terminal 113. Accordingly, the third conductor wire 117 connects the first signal terminal 113 to the signal electrode 124.

The second main electrode 123, the semiconductor substrate 121, and the first main electrode 122 form a conduction path through which the main current flows. Therefore, the semiconductor element 102 includes the conduction path through which the main current flows.

The semiconductor element 102 switches the main current flowing from the second main electrode 123 to the first main electrode 122 via the semiconductor substrate 121 in response to the signal input to the signal electrode 124 for controlling the main current. Therefore, according to the signal input to the first signal terminal 113 for controlling the main current, the semiconductor device 11 switches the main current that flows in sequence from the second main terminal 112 to the first main terminal 111 via the second conductor wire 116, the first conductor layer 131, the solder 103, the second main electrode 123, the semiconductor substrate 121, the first main electrode 122, and the first conductor wire 115.

The semiconductor element 102 emits heat when the main current flows from the second main electrode 123 to the first main electrode 122 via the semiconductor substrate 121 and when switching the main current.

In the first embodiment, the semiconductor element 102 is an insulated gate bipolar transistor (IGBT). When the semiconductor element 102 is an IGBT, the first main electrode 122 is an emitter, the second main electrode 123 is a collector, the signal electrode 124 is a gate, and the signal for controlling the main current is a gate signal. The semiconductor element 102 may be another type of semiconductor element. For example, the semiconductor element 102 may be a metal-oxide-semiconductor field-effect transistor (MOSFET), a thyristor, or a diode. When the semiconductor element 102 is a MOSFET, the first main electrode 122 is a source, the second main electrode 123 is a drain, the signal electrode 124 is a gate, and the signal for controlling the main current is a gate signal. When the semiconductor element 102 is a thyristor, the first main electrode 122 is a cathode, the second main electrode 123 is an anode, the signal electrode 124 is a gate, and the signal for controlling the main current is a gate signal. When the semiconductor element 102 is a diode, the first main electrode 122 is a cathode, the second main electrode 123 is an anode, the semiconductor element 102 is not provided with a signal electrode 124, and the semiconductor device 11 is not provided with the first signal terminal 113 and the third conductor wire 117.

The first conductor wire 115, the second conductor wire 116, and the third conductor wire 117 are made of a conductor, preferably aluminum.

The first main terminal 111, the second main terminal 112, and the first signal terminal 113 are electrically connected to the outside of the semiconductor device 11.

1.3 Laminated Body Structure

As shown in FIGS. 1 and 2, the laminated body 101 includes the first conductor layer 131, a first insulator layer 132, a second conductor layer 133, a second insulator layer 134, and a third conductor layer 135.

The first conductor layer 131, the first insulator layer 132, the second conductor layer 133, the second insulator layer 134, and the third conductor layer 135 are laminated. The first conductor layer 131, the first insulator layer 132, the second conductor layer 133, the second insulator layer 134, and the third conductor layer 135 are laminated in such a manner that the conductor layers and the insulator layers are arranged alternately. The two adjacent layers in the first conductor layer 131, the first insulator layer 132, the second conductor layer 133, the second insulator layer 134, and the third conductor layer 135 are attached to each other.

The first insulator layer 132 is arranged between the first conductor layer 131 and the second conductor layer 133. The first insulator layer 132 separates the first conductor layer 131 from the second conductor layer 133. Accordingly, the first insulator layer 132 electrically insulates the first conductor layer 131 from the second conductor layer 133. The second insulator layer 134 is arranged between the second conductor layer 133 and the third conductor layer 135. The second insulator layer 134 separates the third conductor layer 135 from the second conductor layer 133. Accordingly, the second insulator layer 134 electrically insulates the third conductor layer 135 from the second conductor layer 133.

The semiconductor element 102 is bonded to the first conductor layer 131 by the solder 103. As a result, the semiconductor element 102 is mounted on the first conductor layer 131.

The cooler 104 contacts the third conductor layer 135 with the thermal paste 105 interposed therebetween. As a result, the cooler 104 is connected to the third conductor layer 135.

The second conductor layer 133 is electrically insulated from the conduction path provided in the semiconductor element 102.

The first conductor layer 131, the second conductor layer 133, and the third conductor layer 135 are made of a conductor, preferably metal. The first insulator layer 132 and the second insulator layer 134 are made of an insulator, preferably a resin.

The first insulator layer 132 preferably has a planar shape smaller than a planar shape of the second insulator layer 134. As a result, the occurrence of creeping discharge along the side surfaces of the first insulator layer 132 is suppressed.

1.4 Detection of Breakage of Insulator Layer

As shown in FIGS. 1 and 2, the semiconductor system 1 includes a semiconductor device 11, a monitor circuit 12, and a power supply circuit 13. The semiconductor device 11 includes a second signal terminal 114 and a fourth conductor wire 118.

One end of the fourth conductor wire 118 is connected to the second conductor layer 133. The other end of the fourth conductor wire 118 is connected to the second signal terminal 114. Accordingly, the fourth conductor wire 118 connects the second signal terminal 114 to the second conductor layer 133. This allows easy extraction of a signal indicating that at least one of the insulator layers of the first insulator layer 132 and the second insulator layer 134 has been broken from the semiconductor device 11. The fourth conductor wire 118 may be omitted and the second signal terminal 114 may be directly electrically connected to the second conductor layer 133.

The fourth conductor wire 118 is made of a conductor, preferably aluminum.

The second signal terminal 114 is electrically connected to the outside of the semiconductor device 11.

The monitor circuit 12 is electrically connected to the second signal terminal 114. As a result, the monitor circuit 12 is connected to the second conductor layer 133. The monitor circuit 12 detects the voltage of the second conductor layer 133. The monitor circuit 12 receives a signal indicating that at least one of the insulator layers of the first insulator layer 132 and the second insulator layer 134 has been broken. The monitor circuit 12 detects that at least one of the conductor layers of the first conductor layer 131 and the third conductor layer 135 is electrically short-circuited with the second conductor layer 133 based on the received signal. When detecting that at least one of the conductor layers of the first conductor layer 131 and the third conductor layer 135 is electrically short-circuited with the second conductor layer 133, the monitor circuit 12 transmits a signal to the power supply circuit 13.

The power supply circuit 13 is electrically connected to one of the first main terminal 11 and the second main terminal 112. Accordingly, the power supply circuit 13 is electrically connected to one of the first main terminal 112 and the second main terminal 122. The power supply circuit 13 causes the main current to flow through the semiconductor device 11. The power supply circuit 13 limits the flow of the main current when a signal is received from the monitor circuit 12. Accordingly, the power supply circuit 13 limits the flow of the main current when detecting that at least one of the conductor layers of the first conductor layer 131 and the third conductor layer 135 is electrically short-circuited with the second conductor layer 133. In the first embodiment, limiting the flow of the main current is consistent with stopping the flow of the main current. As a result, the device including the semiconductor device 11 can be safely stopped.

1.5 Fixing and Sealing

As shown in FIGS. 1 and 2, the semiconductor device 11 includes a case 106 and a mold resin 107.

The laminated body 101 is fixed to the case 106 with an adhesive (not shown). The first main surface 101a of the laminated body 101 fixed to the case 106 faces in the direction to an internal space 106i of the case 106. The first main terminal 111, the second main terminal 112, the first signal terminal 113, and the second signal terminal 114 are fixed to the case 106.

The mold resin 107 is filled in the internal space 106i of the case 106. The mold resin 107 is filled on the first main surface of the laminated body 101 with the semiconductor element 102, the solder 103, the first conductor wire 115, the second conductor wire 116, the third conductor wire 117, and the fourth conductor wire 118 covered therein. The mold resin 107 seals the semiconductor element 102, the solder 103, the first conductor wire 115, the second conductor wire 116, the third conductor wire 117, and the fourth conductor wire 118.

The case 106 is made of an insulator, preferably a resin.

1.6 Power Module

The laminated body 101, the semiconductor element 102, the solder 103, the case 106, the mold resin 107, the first conductor wire 115, the second conductor wire 116, the third conductor wire 117, and the fourth conductor wire 118 constitute a power module 141. The power module 141 is mounted on the cooler 104 with the thermal paste 105 interposed therebetween.

In the first embodiment, the semiconductor system 1 includes one power module 141. However, the semiconductor system 1 may include two or more power modules 141. Also, in the first embodiment, the power module 141 includes one semiconductor element 102. However, the power module 141 may include two or more semiconductor element 102. For example, the power module 141 may include two semiconductor elements 102, and the two semiconductor elements 102 may be integrated. Or, the power module 141 may include six semiconductor elements 102, and the six semiconductor elements 102 may be integrated. Two or more semiconductor elements 102 may include two or more types of semiconductor elements. For example, two or more semiconductor elements 102 may include switching elements such as IGBTs and MOSFETs, and freewheeling diodes.

When the power module 141 includes two or more semiconductor elements 102, conductor layer patterning is performed in order for the power module 141 to include two or more portions of the first conductor layer 131 on which two or more semiconductor elements 102 are mounted.

1.7 Method of Manufacturing Semiconductor Device

FIGS. 3A to 3D are cross-sectional views illustrating a method of manufacturing the semiconductor device provided in the semiconductor system of the first embodiment.

Figure 3A:
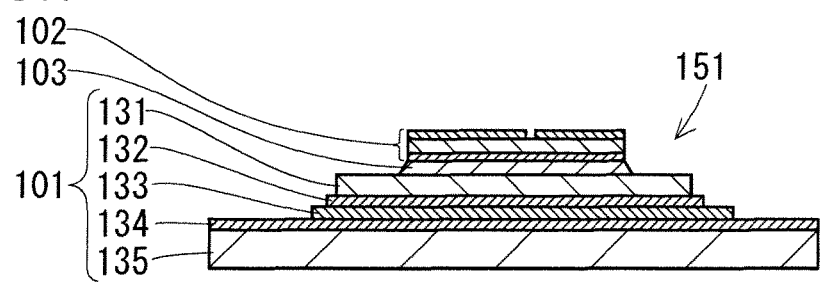
FIGS. 3A to 3D Cross-sectional views illustrating a method of manufacturing a semiconductor device provided in the semiconductor system of the first embodiment.

When the semiconductor device 11 is manufactured, as shown in FIG. 3A, the laminated body with semiconductor element 151 is manufactured. The laminated body with semiconductor element 151 includes the laminated body 101, the semiconductor element 102, and the solder 103. The semiconductor element 102 is bonded to the first conductor layer 131 by the solder 103. As a result, the semiconductor element 102 is mounted on the first conductor layer 131.

Figure 3B:
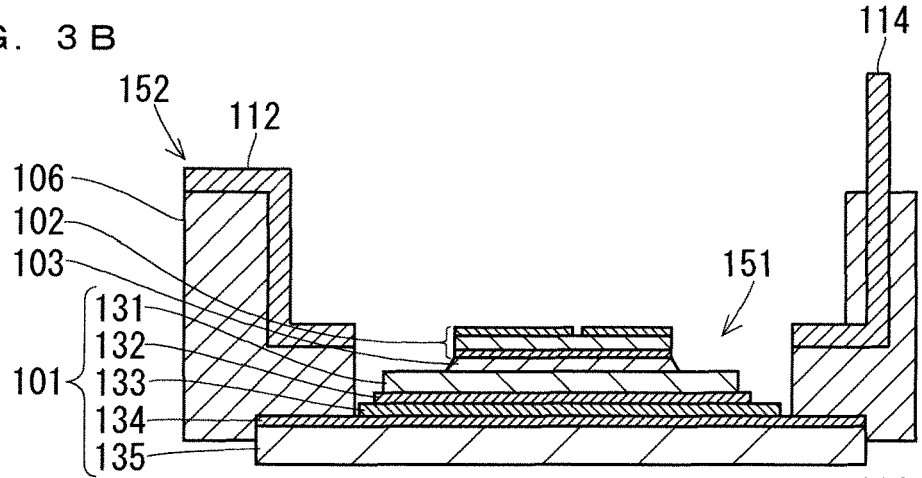

Subsequently, as shown in FIG. 3B, a case with terminals 152 is manufactured. The case with terminals 152 includes the first main terminal 111, the second main terminal 112, the first signal terminal 113, the second signal terminal 114, and the case 106. The first main terminal 111, the second main terminal 112, the first signal terminal 113, and the second signal terminal 114 are fixed to the case 106. Further, after the case with terminals 152 is manufactured, the laminated body 101 is fixed to the case 106.

Figure 3C:
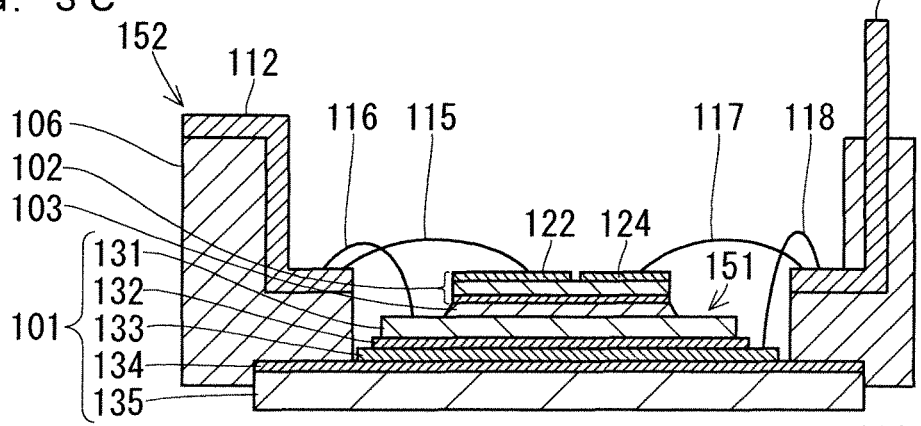

Subsequently, as illustrated in FIG. 3C, one end of the first conductor wire 115 is connected to the first main electrode 122, and the other end of the first conductor wire 115 is connected to the first main terminal 111. Further, one end of the second conductor wire 116 is connected to the first conductor layer 131, and the other end of the second conductor wire 116 is connected to the second main terminal 112. Further, one end of the third conductor wire 117 is connected to the signal electrode 124, and the other end of the third conductor wire 117 is connected to the first signal terminal 113. Further, one end of the fourth conductor wire 118 is connected to the second conductor layer 133, and the other end of the fourth conductor wire 118 is connected to the second signal terminal 114.

Figure 3D:
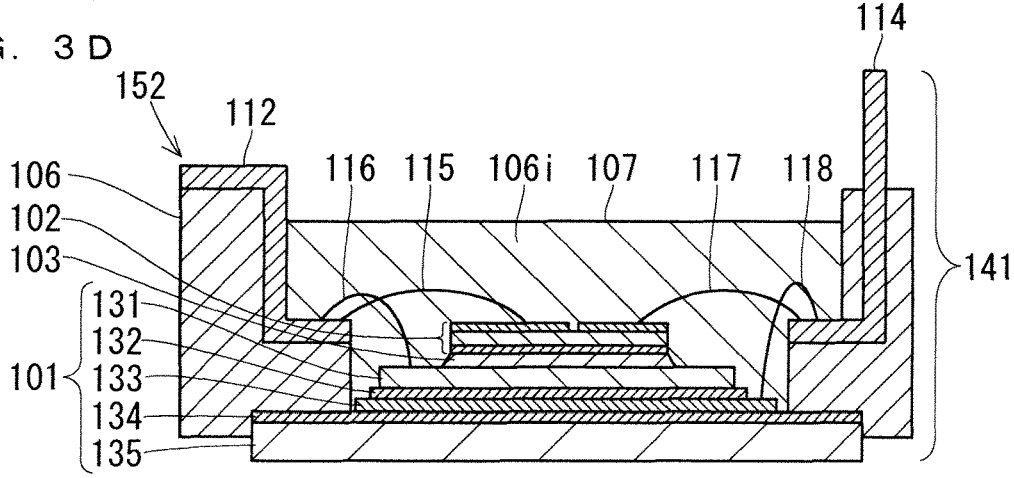

Subsequently, as shown in FIG. 3D, the mold resin 107 is filled in the internal space 106i of the case 106. At that point, the pre-cured fluid of the mold resin 107 is injected into the internal space 106i, and the injected pre-cured fluid is cured and turned into the mold resin 107.

Subsequently, as illustrated in FIG. 1, the cooler 104 is connected to the third conductor layer 135. At that point, the cooler 104 is brought into contact with the laminated body 101 with the thermal paste 105 interposed therebetween.

8 Comparison Between First Reference Example and First Embodiment

Figure 4:
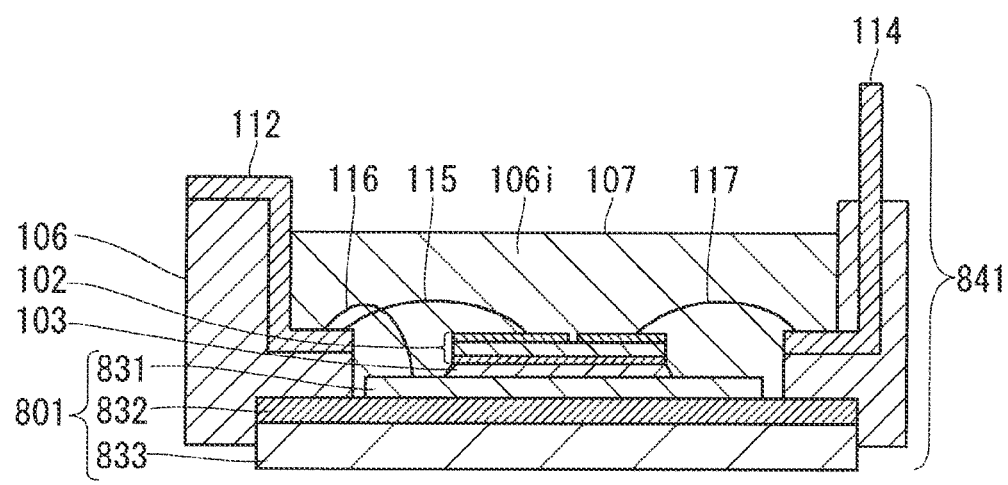
FIG. 4 A cross-sectional view schematically showing a cross section of a power module of the first reference example.
Figure 5:
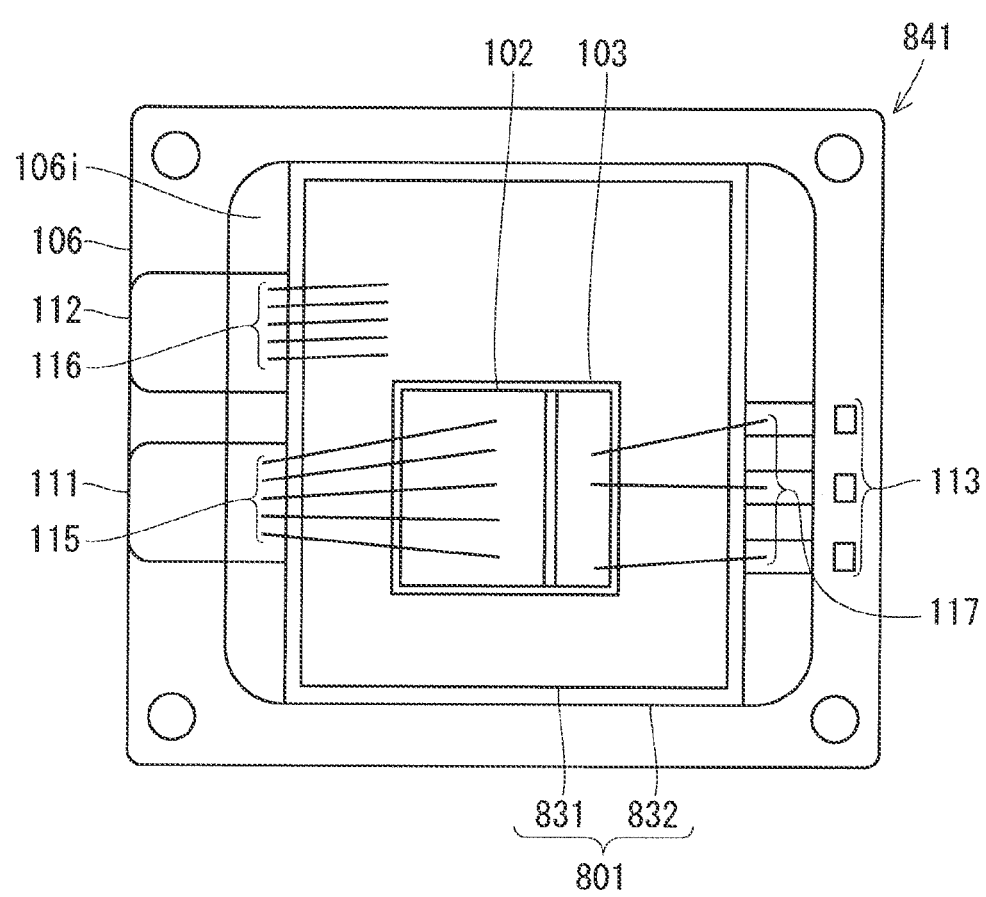
FIG. 5 A top view schematically showing the upper surface of the power module from which a mold resin has been removed from the power module of the first reference example.

FIG. 4 is a cross-sectional view schematically showing a cross section of a power module of the first reference example. FIG. 5 is a top view schematically showing the upper surface of the power module from which a mold resin has been removed from the power module of the first reference example.

As shown in FIGS. 4 and 5, in a power module 841 of the first reference example, the laminated body 801 includes a first conductor layer 831, an insulator layer 832, and a second conductor layer 833. The insulator layer 832 electrically insulates the first conductor layer 831 from the second conductor layer 833. The semiconductor element 102 is mounted on the first conductor layer 831. The cooler 104 is connected to the second conductor layer 833.

In the power module 841, when an initial defect is formed in the insulator layer 832 when the laminated body 801 is manufactured, and the power module 841 is incorporated into the device without detecting the formed initial defect, the semiconductor element 102 is immediately electrically short-circuited with the cooler 104, resulting in malfunction such as a ground fault of the semiconductor element 102, when the insulator layer 832 is dielectrically broken due to the initial defect due to the voltage, heat, humidity, vibration, and the like.

Whereas, in the power module 141 illustrated in FIGS. 1 and 2, the laminated body 101 includes the first conductor layer 131, the first insulator layer 132, the second conductor layer 133, the second insulator layer 134, and the third conductor layer 135. The first insulator layer 132 electrically insulates the first conductor layer 131 from the second conductor layer 133. The second insulator layer 134 electrically insulates the third conductor layer 135 from the second conductor layer 133. The semiconductor element 102 is mounted on the first conductor layer 131. The cooler 104 is connected to the third conductor layer 835.

In the power module 141, when an initial defect is formed in the first insulator layer 132 or the second insulator layer 134 when the laminated body 101 is manufactured, and the power module 141 is incorporated into the device without detecting the formed initial defect, the semiconductor element 102 is not immediately electrically short-circuited with the cooler 104, and malfunction such as a ground fault of the semiconductor element 102 is not immediately generated, when the first insulator layer 132 or the second insulator layer 134 is dielectrically broken due to the initial defect due to the voltage, heat, humidity, vibration, and the like.

1.9 Effect of Invention of First Embodiment

According to the invention of the first embodiment, the first conductor layer 131 and the third conductor layer 135 are electrically insulated from the second conductor layer 133 arranged between the first conductor layer 131 and the third conductor layer 135. Therefore, when one of the first conductor layer 131 and the third conductor layer 135 is electrically short-circuited with the second conductor layer 133, the first conductor layer 131 does not electrically short-circuit with the third conductor layer 135. This suppresses the electrical short circuit of the semiconductor element 102 mounted on the first conductor layer 131 with the cooler 104 connected to the third conductor layer 135.

Further, according to the invention of the first embodiment, even when the margin of the insulator property of the first insulator layer 132 and the second insulator layer 134 is made smaller, the electrical short circuit of the semiconductor element 102 with the cooler 104 can be suppressed. Therefore, the total thickness of the first insulator layer 132 and the second insulator layer 134 can be reduced. For example, while in the power module 841, the thickness of the insulator layer 832 must be determined so that the insulator layer 832 has a dielectric voltage of about 10 times the power supply voltage, in the power module 141, the thicknesses of the first insulator layer 132 and the second insulator layer 134 are determined so that the first insulator layer 132 and the second insulator layer 134 have an dielectric voltage of about twice the power supply voltage. As a result, the thermal resistance of the laminated body 101 can be reduced. As a result, the heat emitted by the semiconductor element 102 can be efficiently released.

Figure 6:
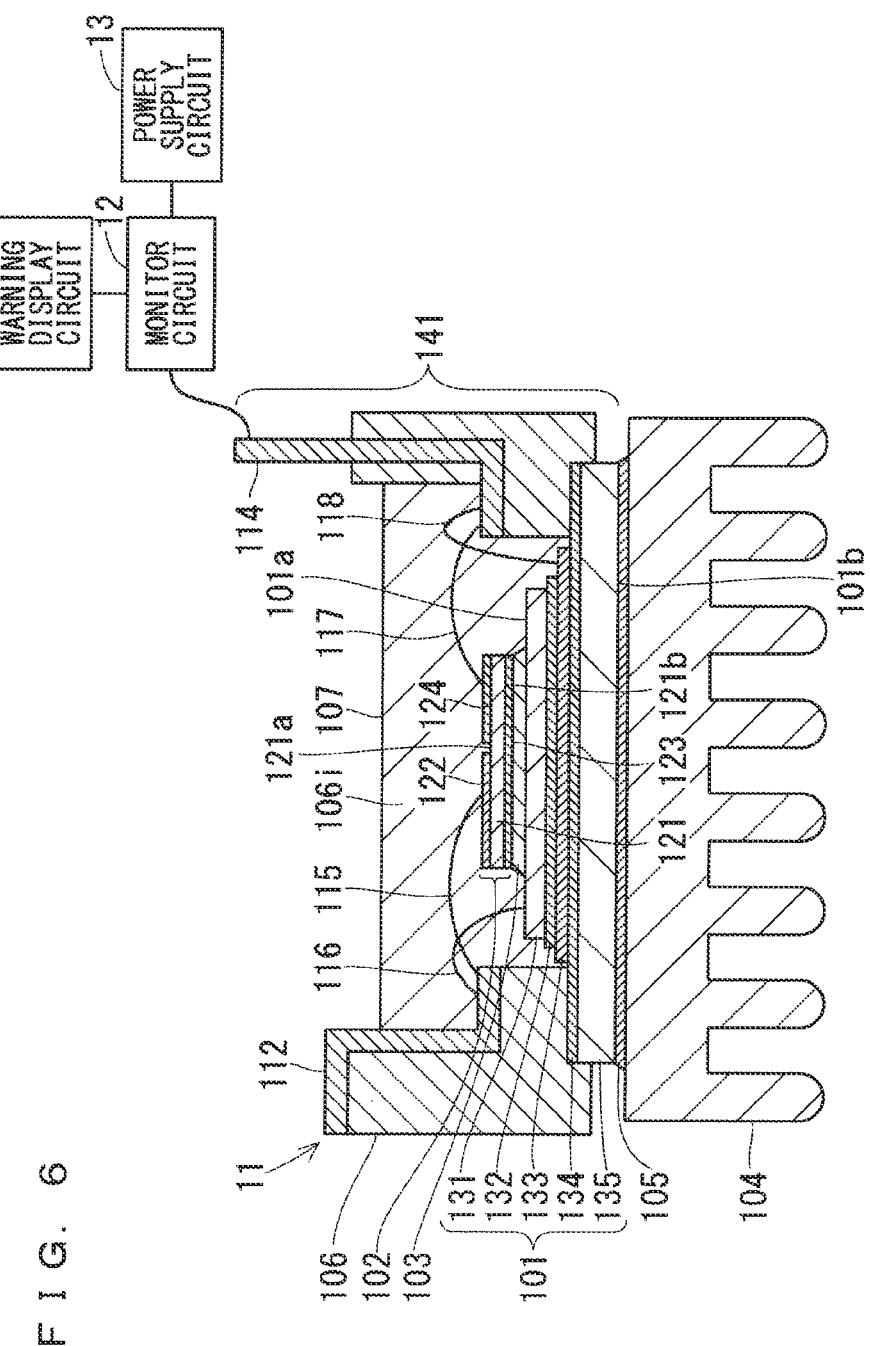
FIG. 6 A diagram schematically illustrating a semiconductor system of the second embodiment.

2. Second Embodiment 2.1 Main Differences Between First Embodiment and Second Embodiment FIG. 6 is a diagram schematically illustrating a semiconductor system of the second embodiment. FIG. 6 includes a cross-sectional view schematically showing a cross section of a semiconductor device provided in the semiconductor system of the second embodiment.

The semiconductor system 2 of the second embodiment illustrated in FIG. 6 differs from the semiconductor system 1 of the first embodiment illustrated in FIGS. 1 and 2 mainly in the following points. Except for the points described below, the same configuration as that adopted in the semiconductor system 1 is adopted in the semiconductor system 2.

As shown in FIG. 6, the semiconductor system 2 includes a warning display circuit 14.

When detecting that at least one of the conductor layers of the first conductor layer 131 and the third conductor layer 135 is electrically short-circuited with the second conductor layer 133, the monitor circuit 12 transmits a signal to the warning display circuit 14.

When the warning display circuit 14 receives a signal from the monitor circuit 12, the warning display circuit 14 issues a warning by displaying a warning. Accordingly, the warning display circuit 14 issues a warning by displaying the warning when it is detected that at least one of the conductor layers of the first conductor layer 131 and the third conductor layer 135 is electrically short-circuited with the second conductor layer 133. The warning display circuit 14 is a warning device that issues a warning by displaying the warning. The warning display circuit 14 may be replaced with a warning device that issues a warning in a manner other than displaying the warning. The warning display circuit 14 may be replaced with a warning sound generation circuit that issues a warning by warning sound.

Further, in the semiconductor system 2, limiting the flow of the main current means lowering the output voltage of the power supply circuit 13 without stopping the flow of the main current.

2.2 Effect of Invention of Second Embodiment

The invention of the second embodiment has the same effect as that of the invention of the first embodiment.

In addition, according to the invention of the second embodiment, a user of a device in which the power module 141 is incorporated can recognize that the conductor layer of at least one of the first conductor layer 131 and the third conductor layer 135 is electrically short-circuited with the conductor layer 133 by the warning. As a result, the power module 141 can be replaced with a new power module at the stage where one of the first conductor layer 131 and the second conductor layer 133 is electrically short-circuited with the second conductor layer 133 and the other of the first conductor layer 131 and the second conductor layer 133 is not short-circuited, and the semiconductor element 102 is not electrically short-circuited with the cooler 104.

Further, according to the invention of the second embodiment, the output voltage of the power supply circuit 13 is lowered without stopping the main current flow until the power module 141 is replaced with a new power module 141. As a result, the occurrence of the malfunction such as a ground fault of the semiconductor element 102 where, after one of the first insulator layer 132 and the second insulator layer 134 is broken, the other of the first insulator layer 132 and the second insulator layer 134 is further broken, is suppressed. Further, the occurrence of a malfunction caused by an abrupt stop of the device in which, the power module 141, which is incorporated therein, abruptly stops after one of the first insulator layer 132 and the second insulator layer 134 is broken is suppressed.

3. Third Embodiment

3.1 Main Differences Between First Embodiment and Third Embodiment

FIG. 7 is a diagram schematically illustrating a semiconductor system of the third embodiment. FIG. 7 includes a cross-sectional view schematically showing a cross section of a semiconductor device provided in the semiconductor system of the third embodiment.

The semiconductor system 3 of the third embodiment illustrated in FIG. 7 differs from the semiconductor system 1 of the first embodiment illustrated in FIGS. 1 and 3 mainly in the following points. Except for the points described below, the same configuration as that adopted in the semiconductor system 1 is adopted in the semiconductor system 3.

In the semiconductor system 3, the semiconductor device 11 does not include the case 106 to which the first main terminal 111, the second main terminal 112, and the first signal terminal 113 are fixed.

Further, in the semiconductor system 3, the semiconductor device 11 does not include the first conductor wire 115 that electrically connects the first main terminal 111 to the main electrode 122. Instead, the semiconductor device 11 includes solder 108 that bonds the first main terminal 111 to the main electrode 122 to electrically connect the first main terminal 111 to the main electrode 122.

Also, in the semiconductor system 3, the semiconductor device 11 does not include the second signal terminal 114 and the fourth conductor wire 118. Instead, the semiconductor device 11 includes a lead 109. One end of the lead 109 is connected to the second conductor layer 133. The other end of the lead 109 is connected to the monitor circuit 12. As a result, the monitor circuit 12 is electrically connected to the second conductor layer 133.

Further, in the semiconductor system 3, the first conductor layer 131 is a metal plate, the solder 103 bonds the second main electrode 123 to the first conductor layer 131 to electrically connect the second main electrode 123 to the conductor layer 131.

Further, in the semiconductor system 3, the first insulator layer 132 and the second conductor layer 133 constitute a first integrated component 161. And, the second insulator layer 134 and the third conductor layer 135 constitute a second integrated component 162.

Further, in the semiconductor system 3, the semiconductor element 102, the first conductor layer 131, and the first integrated component 161 are arranged on the first main surface 162a of the second integrated component 162. Further, from the side of the first main surface 162a of the second integrated component 162, the mold resin 107 covers a part of the first main terminal 111, a part of the second main terminal 112, a part of the first signal terminal 113, the semiconductor element 102, the first conductor layer 131, the first integrated component 161, and the second integrated component 162. However, the mold resin 107 does not cover the second main surface 162b of the second integrated component 162. The first main surface 162a of the second integrated component 162 is on the side where the second insulator layer 134 is arranged. The second main surface 162b of the second integrated component 162 is on the side where the third insulator layer 135 is arranged. With this, the mold resin 107 can be molded by the transfer molding method. With this, the semiconductor device 11 can be easily manufactured.

3.2 Method of Manufacturing Semiconductor Device

FIGS. 8A to 8F are cross-sectional views illustrating a method of manufacturing the semiconductor device provided in the semiconductor system of the third embodiment.

When the semiconductor device 11 is manufactured, as shown in FIG. 8A, the semiconductor element 102 is mounted on the first conductor layer 131. At this point, the semiconductor element 102 is bonded to the first conductor layer 131 by the solder 103.

Subsequently, as shown in FIG. 8B, a lead frame 171 is bonded to the semiconductor element 102. At that point, the first main electrode 122 is bonded to the first main terminal 111 provided in the lead frame 171 by the solder 108. The lead frame 171 is formed by processing one sheet of metal plate. The lead frame 171 includes the first main terminal 111, the second main terminal 112, and the first signal terminal 113.

Further, as illustrated in FIG. 8C, one end of the third conductor wire 117 is connected to the signal electrode 124, and the other end of the third conductor wire 117 is connected to the first signal terminal 113 provided in the lead frame 171. Further, one end of the second conductor wire 116 is connected to the first conductor layer 131, and the other end of the second conductor wire 116 is connected to the second main terminal 112 provided in the lead frame 171.

Subsequently, as illustrated in FIG. 8D, the first integrated component 161 including the laminated first insulator layer 132 and the second conductor layer 133 is manufactured. At that point, the pre-cured fluid of the insulating resin is coated on the second conductor layer 133, and the applied pre-cured fluid is semi-cured and changed into the first insulator layer 132. The first integrated component 161 has the first main surface 161a on the side where the first insulator layer 132 is arranged and the second main surface 161b on the side where the second conductor layer 133 is arranged.

And, the second integrated component 162 including the laminated second insulator layer 134 and the third conductor layer 135 is manufactured. At that point, the pre-cured fluid of the insulating resin is coated on the third conductor layer 135, and the applied pre-cured fluid is semi-cured and changed into the second insulator layer 134. The second integrated component 162 has the first main surface 162a on the side where the second insulator layer 134 is arranged and the second main surface 162b on the side where the third conductor layer 135 is arranged.

Then, the semiconductor element 102, the first conductor layer 131, the first integrated component 161, and the second integrated component 162 are set in a lower mold 173 so that the semiconductor element 102, the first conductor layer 131, and the first integrated component 161 are arranged on the first main surface 162a of the second integrated component 162. At that point, the first main surface 161a of the first integrated component 161 and the first main surface 162a of the second integrated component 162 are placed upward.

Subsequently, as shown in FIG. 8E, the mold resin 107 is molded by the transfer molding method. From the side of the first main surface 162a of the second integrated component 162, the mold resin 107 covers a part of the lead frame 171, the solder 108, the semiconductor element 102, the solder 103, the first conductor layer 131, and the first integrated component 161, and the second integrated component 162, and does not cover the second main surface 162b of the second integrated component 162. When the mold resin 107 is molded, the lower mold 173 is closed by an upper mold 174. Further, the pre-cured fluid of the mold resin 107 is injected into a mold 175 including the lower mold 173 and the upper mold 174 that closes the lower mold 173, and the injected pre-cured fluid is cured and changed into the mold resin 107. As a result, the part of the lead frame 171, the solder 108, the semiconductor element 102, the solder 103, the first conductor layer 131, and the first integrated component 161 are sealed with the mold resin 107.

The pre-cured fluid of the mold resin 107 is made of a thermosetting resin. Therefore, the pre-cured fluid of the mold resin 107 is cured by being placed under high temperature and high pressure inside the mold 175. When the pre-cured fluid of the mold resin 107 is cured, the semi-cured first insulator layer 132 and the second insulator layer 134 are also completely cured, the first insulator layer 132 is adhered to the first conductor layer 131 and the second conductor layer 133, and the second insulator layer 134 is adhered to the second conductor layer 133 and the third conductor layer 135.

It should be noted that, one end of the lead 109 is connected to the second conductor layer 133 before the second conductor layer 133 is set in the lower mold 173. When the second conductor layer 133 is set in the lower mold 173, the other end of the lead 109 is arranged so that the other end of the lead 109 is not embedded in the mold resin 107.

Subsequently, as shown in FIG. 8F, the laminated body with semiconductor element 151 including the lead frame 171, the solder 108, the semiconductor element 102, the solder 103, the laminated body 101, and the mold resin 107 is taken out from inside the mold 175. Further, the taken-out laminated body with semiconductor element 151 is subject to processing. At this point, unnecessary parts such as tie bars and the frame portion provided in the lead frame 171 are severed with the first main terminal 111, the second main terminal 112, and the first signal terminal 113 provided in the lead frame 171 remaining left. Further, the remaining first main terminal 111, second main terminal 112, and first signal terminal 113 are formed and the appropriate outer shape is given to the first main terminal 111, the second main terminal 112, and the first signal terminal 113.

Subsequently, as illustrated in FIG. 7, the cooler 104 is connected to the third conductor layer 135. At that point, the cooler 104 is brought into contact with the laminated body 101 with the thermal paste 105 interposed therebetween.

3.3 Comparison Between Second Reference Example and Third Embodiment

FIG. 9 is a cross-sectional view schematically showing a cross section of a semiconductor device of the second reference example.

In a semiconductor device 91 of the second reference example illustrated in FIG. 9, a laminated body 901 includes a first conductor layer 931, an insulator layer 932, and a second conductor layer 933. The insulator layer 932 electrically insulates the first conductor layer 931 from the second conductor layer 933. The semiconductor element 102 is mounted on the first conductor layer 931. The cooler 104 is connected to the second conductor layer 933.

In the semiconductor device 91, when an initial defect is formed in the insulator layer 932 when the laminated body 901 is manufactured, and the power module 941 is incorporated into the device without detecting the formed initial defect, the semiconductor element 102 is immediately electrically short-circuited with the cooler 104, resulting in malfunction such as a ground fault of the semiconductor element 102, when the insulator layer 932 is dielectrically broken due to the initial defect due to the voltage, heat, humidity, vibration, and the like.

Whereas, in the semiconductor device 11 illustrated in FIG. 7, the laminated body 101 includes the first conductor layer 131, the first insulator layer 132, the second conductor layer 133, the second insulator layer 134, and the third conductor layer 135. The first insulator layer 132 electrically insulates the first conductor layer 131 from the second conductor layer 133. The second insulator layer 134 electrically insulates the third conductor layer 135 from the second conductor layer 133. The semiconductor element 102 is mounted on the first conductor layer 131. The cooler 104 is connected to the third conductor layer 135.

In the semiconductor device 11, when an initial defect is formed in the first insulator layer 132 or the second insulator layer 134 when the laminated body 101 is manufactured, and the power module 141 is incorporated into the device without detecting the formed initial defect, the semiconductor element 102 is not immediately electrically short-circuited with the cooler 104, and malfunction such as a ground fault of the semiconductor element 102 is not immediately generated, when the first insulator layer 132 or the second insulator layer 134 is broken due to the initial defect due to the voltage, heat, humidity, vibration, and the like.

3.4 Effect of Invention of Third Embodiment

The invention of the third embodiment has the same effect as that of the invention of the first embodiment.

In addition, according to the third embodiment, the mold resin 107 is molded by the transfer molding method. With this, the semiconductor device 11 can be easily manufactured.

4. Fourth Embodiment 4.1 Main Differences Between Third Embodiment and Fourth Embodiment FIG. 10 is a diagram schematically illustrating a semiconductor system of the fourth embodiment. FIG. 10 includes a cross-sectional view schematically showing a cross section of a semiconductor device provided in the semiconductor system of the fourth embodiment.

The semiconductor system 4 of the fourth embodiment illustrated in FIG. 10 differs from the semiconductor system 3 of the third embodiment illustrated in FIG. 7 mainly in the following points. Except for the points described below, the same configuration as that adopted in the semiconductor system 3 is adopted in the semiconductor system 4.

In the semiconductor system 4, the second conductor layer 133 has a thickness thicker than that of the third conductor layer 135.

4.2 Effect of Invention of Fourth Embodiment

The invention of the fourth embodiment has the same effect as that of the invention of the third embodiment.

In addition, according to the invention of the fourth embodiment, breaking of the second insulator layer 134 by heat, impact, or the like generated when the first insulator layer 132 breaks is suppressed.

The second conductor layer 133 provided in the first integrated component 161 is often a thin foil having a thickness of about 0.1 mm. The effect of suppressing the breaking of the second insulator layer 134 described above is particularly remarkable when the thickness of the second conductor layer 133 is thin as described above.

5. Fifth Embodiment

Figure 11:
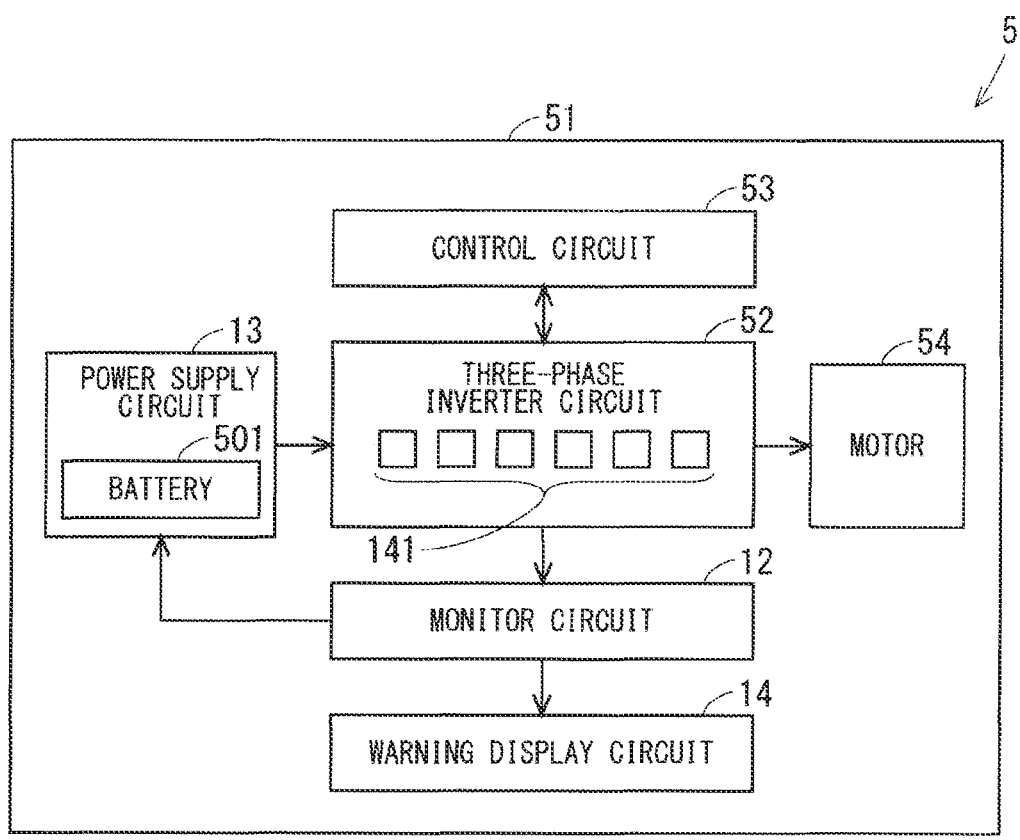
FIG. 11 A diagram schematically illustrating a moving body of the fifth embodiment.

FIG. 11 is a diagram schematically illustrating a moving body of the fifth embodiment.

A moving body 5 of the fifth embodiment illustrated in FIG. 11 represents an electric vehicle, a train, an electric locomotive, an electric motorcycle, an electric propulsion ship, an electric aircraft, an electric assisted bicycle, an electric wheelchair, or the like.

The moving body 5 includes a body 51, a power supply circuit 13, a three-phase inverter circuit 52, a control circuit 53, a monitor circuit 12, a warning display circuit 14, and a motor 54. The power supply circuit 13 includes a battery 501. The three-phase inverter circuit 52 includes six power modules 141. The six power modules 141, the monitor circuit 12, the power supply circuit 13, and the warning display circuit 14 constitute the semiconductor system 2 of the second embodiment. The six power modules 141, the monitor circuit 12, and the power supply circuit 13 may constitute the semiconductor system 1 of the first embodiment, the semiconductor system 3 of the third embodiment, or the semiconductor system 4 of the fourth embodiment.

The power supply circuit 13 supplies direct current to the three-phase inverter circuit 52. The direct current supplied is the direct current discharged by the battery 501. The three-phase inverter circuit 52 converts the supplied direct current into a three-phase alternating current, and supplies the three-phase alternating current to the motor 54. When the three-phase inverter circuit 52 converts a direct current into a three-phase alternating current, the six semiconductor elements 102 provided in each of the six power modules 141 switch the supplied direct current. The motor 54 rotates according to the supplied three-phase alternating current. The rotation of the motor 54 is controlled by the frequency at which the six power modules 141 switch direct current.

One of the first main terminal 111 and the second main terminal 112 are electrically connected to the power supply circuit 13. The other of the first main terminal 111 and the second main terminal 112 are electrically connected to the motor 54. The first signal terminal 113 is electrically connected to the control circuit 53. The control circuit 53 outputs signals input to the power modules 141. Also, the signals output by the power modules 161 are input to the control circuit 53.

The monitor circuit 12 may monitor the voltage between the second conductor layer 133 and the body 51. In such a case, the monitor circuit 12 detects that the third conductor layer 135 is electrically short-circuited with the second conductor layer 133 based on the result of the monitoring.

According to the invention of the fifth embodiment, a driver of the moving body 5 can recognize that the conductor layer of at least one of the first conductor layer 131 and the third conductor layer 135 is electrically short-circuited with the conductor layer 133 by the warning. As a result, the moving body 5 is brought to a dealer, a repair shop or the like, the power module 141 can be replaced with a new power module at the stage where one of the first conductor layer 131 and the second conductor layer 133 is electrically short-circuited with the second conductor layer 133 and the other of the first conductor layer 131 and the second conductor layer 133 is not short-circuited, and the semiconductor element 102 is not electrically short-circuited with the cooler 104.

Further, according to the invention of the fifth embodiment, the output voltage of the power supply circuit 13 is lowered without stopping the main current flow until the power module 141 is replaced with a new power module 141. As a result, the occurrence that after one of the first insulator layer 132 and the second insulator layer 134 is broken, the other of the first insulator layer 132 and the second insulator layer 134 is further broken, is suppressed.

Further, the occurrence of a risk arising by an abrupt stop of the moving body 5 in which, the power modules 141, which are incorporated therein, abruptly stops after one of the first insulator layer 132 and the second insulator layer 134 is broken is suppressed. For example, when the moving body 5 is an electric vehicle, prevention of the moving body 5 from being stalled due to an abrupt halt while the moving body 5 is traveling on a highway is ensured.

The power modules 141 may be incorporated in a device other than the three-phase inverter circuit 52. For example, the power modules 141 may be incorporated in a converter that converts regenerative power into a direct current.

In the present invention, the embodiments can be combined, appropriately modified or omitted, without departing from the scope of the invention.

While the invention has been shown and described in detail, the foregoing description is in all aspects illustrative and not restrictive. It is understood that numerous other modifications not having been described can be devised without departing from the scope of the invention.

Explanation of Reference Signs 1, 2, 3, 4 semiconductor system, 11 semiconductor device, 12 monitor circuit, 13 power supply circuit, 14 warning display circuit, 101 laminated body, 102 semiconductor element, 104 cooler, 111 first main terminal, 112 second main terminal, 113 first signal terminal, 114 second signal terminal, 115 first conductor wire, 116 second conductor wire, 117 third conductor wire, 118 fourth conductor wire, 122 first main electrode, 123 second main electrode, 124 signal electrode, 131 first conductor layer, 132 first insulator layer, 133 second conductor layer, 134 second insulator layer, 135 third conductor layer, 151 laminated body with semiconductor element, 161 first integrated component, 162 second integrated component, 171 lead frame, 172 laminated body with semiconductor element, 5 moving body, 51 body, 52 three-phase inverter circuit, 53 control circuit, 54 motor.

The invention claimed is:

1. A semiconductor device comprising:
   a laminated body including a first conductor layer, a first insulator layer, a second conductor layer, a second insulator layer, and a third conductor layer laminated, in which the first insulator layer is arranged between the first conductor layer and the second conductor layer and electrically insulates the first conductor layer from the second conductor layer, and the second insulator layer is arranged between the second conductor layer and the third conductor layer and electrically insulates the third conductor layer from the second conductor layer;
   a semiconductor element mounted on the first conductor layer; and
   a cooler connected to the third conductor layer; wherein
   the first insulator layer has a planar shape smaller than a planar shape of the second insulator layer.

2. The semiconductor device according to claim 1, wherein
   the semiconductor device includes a conduction path through which a main current flows, and
   the second conductor layer is electrically insulated from the conduction path.

3. The semiconductor device according to claim 1, further comprising
   a signal terminal electrically connected to the second conductor layer.

4. The semiconductor device according to claim 3, further comprising
   a conductor wire that electrically connects the second conductor layer to the signal terminal.

5. The semiconductor device according to claim 1, wherein
   the second conductor layer has a thickness thicker than that of the third conductor layer.

6. The semiconductor device according to claim 1, wherein
   the first insulator layer and the second conductor layer constitute a first integrated component,
   the second insulator layer and the third conductor layer constitute a second integrated component,
   the second integrated component has a first main surface on a side on which the second insulator layer is arranged and a second main surface on a side on which the third conductor layer is arranged,
   the semiconductor element includes a main electrode and a signal electrode,
   the semiconductor element, the first conductor layer, and the first integrated component are arranged on the first main surface, and
   the semiconductor device further comprising a main terminal electrically connected to the main electrode, a signal terminal electrically connected to the signal electrode, a mold resin that covers from a side of the first main surface, a part of the main terminal, a part of the signal terminal, the semiconductor element, the first conductor layer, the first integrated component, and the second integrated component, and does not cover the second main surface.

7. A semiconductor system comprising:
   a semiconductor device comprising:
      a laminated body including a first conductor layer, a first insulator layer, a second conductor layer, a second insulator layer, and a third conductor layer laminated, in which the first insulator layer is arranged between the first conductor layer and the second conductor layer and electrically insulates the first conductor layer from the second conductor layer, and the second insulator layer is arranged between the second conductor layer and the third conductor layer and electrically insulates the third conductor layer from the second conductor layer;
      a semiconductor element mounted on the first conductor layer; and
      a cooler connected to the third conductor layer;
   a monitor circuit that is electrically connected to the second conductor layer and detects that at least one of conductor layers of the first conductor layer and the third conductor layer is electrically short-circuited with the second conductor layer; and
   a power supply circuit that causes a main current to flow through the semiconductor device and, when that the at least one of the conductor layers is electrically short-circuited with the second conductor layer is detected, limits the flow of the main current.

8. The semiconductor system according to claim 7, wherein
   limiting the flow of the main current includes stopping the flow of the main current.

9. The semiconductor system according to claim 7, wherein
   limiting the flow of the main current includes lowering an output voltage of the power supply circuit without stopping the flow of the main current.

10. The semiconductor system according to claim 7, further comprising
- a warning device configured to issue a warning when that the at least one of the conductor layers is electrically short-circuited with the second conductor layer is detected.

11. A moving body comprising
the semiconductor system according to claim 7.

12. The moving body according to claim 11, wherein
the at least one of the conductor layers includes the third conductor layer,
the moving body further comprises a body, and
the monitor circuit performs monitoring of voltage between the second conductor layer and the body and detects that the third conductor layer is short-circuited with the second conductor layer based on a result of the monitoring.

13. A semiconductor system comprising:
a semiconductor device comprising:
- a laminated body including a first conductor layer, a first insulator layer, a second conductor layer, a second insulator layer, and a third conductor layer laminated, in which the first insulator layer is arranged between the first conductor layer and the second conductor layer and electrically insulates the first conductor layer from the second conductor layer, and the second insulator layer is arranged between the second conductor layer and the third conductor layer and electrically insulates the third conductor layer from the second conductor layer;
- a semiconductor element mounted on the first conductor layer; and
- a cooler connected to the third conductor layer;
a monitor circuit that is electrically connected to the second conductor layer and detects that at least one of conductor layers of the first conductor layer and the third conductor layer is electrically short-circuited with the second conductor layer; and
a warning device configured to issue a warning when that the at least one of the conductor layers is electrically short-circuited with the second conductor layer is detected.

* * * * *